(12) United States Patent
Oh et al.

(10) Patent No.: US 11,927,995 B2
(45) Date of Patent: Mar. 12, 2024

(54) DISPLAY DEVICE

(71) Applicant: Samsung Display Co., LTD., Yongin-si (KR)

(72) Inventors: Myong Soo Oh, Asan-si (KR); Seung Ho Choi, Cheonan-si (KR); Ji Hoon Hwang, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 17 days.

(21) Appl. No.: 17/527,600

(22) Filed: Nov. 16, 2021

(65) Prior Publication Data

US 2022/0075432 A1 Mar. 10, 2022

Related U.S. Application Data

(63) Continuation of application No. 16/822,829, filed on Mar. 18, 2020, now Pat. No. 11,199,883.

(30) Foreign Application Priority Data

Jul. 16, 2019 (KR) .................. 10-2019-0086022

(51) Int. Cl.
*G06F 1/18* (2006.01)
*G02F 1/1362* (2006.01)
*G06F 1/16* (2006.01)
*H10K 59/131* (2023.01)

(52) U.S. Cl.
CPC ........ *G06F 1/189* (2013.01); *G02F 1/136286* (2013.01); *G06F 1/1652* (2013.01); *H10K 59/131* (2023.02)

(58) Field of Classification Search
CPC .......... G06F 1/189; G06F 1/18; G06F 1/1652; H10K 59/131; G02F 1/136286
USPC ....................................................... 174/261
See application file for complete search history.

(56) References Cited

U.S. PATENT DOCUMENTS

2015/0179728 A1* 6/2015 Kwon .................. H10K 59/124
                                                                438/23
2021/0109414 A1   4/2021 Kabe et al.

FOREIGN PATENT DOCUMENTS

| KR | 10-0339334 | 6/2002 |
|----|------------|--------|
| KR | 10-1386574 | 4/2014 |
| KR | 10-1422746 | 7/2014 |

* cited by examiner

*Primary Examiner* — Tremesha S Willis
(74) *Attorney, Agent, or Firm* — KILE PARK REED & HOUTTEMAN PLLC

(57) ABSTRACT

A display device includes a base substrate including a display area and a non-display area at a periphery of the display area; a first signal wiring on the non-display area of the base substrate and including a first wiring part and a second wiring part connected to the first wiring part; and a printed circuit board including a lead wiring on the first signal wiring. The second wiring part includes an open part passing through a surface of the second wiring part in a thickness direction, the second wiring part includes a long side extending along a first direction and a short side extending along a second direction intersecting the first direction, and a separation distance between the open part and an end of the short side of the second wiring part in the first direction is within about 0.4 times the long side of the second wiring part.

15 Claims, 17 Drawing Sheets

DISPLAY DEVICE

CROSS REFERENCE TO RELATED APPLICATION(S)

This is a continuation application of U.S. patent application Ser. No. 16/822,829, filed Mar. 18, 2020, now issued as U.S. Pat. No. 11,199,883, the disclosure of which is incorporated herein by reference in its entirety. U.S. patent application Ser. No. 16/822,829 claims priority to and benefit of Korean Patent Application No. 10-2019-0086022 under 35 U.S.C. § 119, filed on Jul. 16, 2019, in the Korean Intellectual Property Office, the entire contents of which are incorporated herein by reference.

BACKGROUND

1. Field of the Disclosure

The disclosure relates to a display device.

2. Description of the Related Art

Display devices are becoming increasingly important with the increasing developments of multimedia. In response to the increasing developments of multimedia, various display devices such as a liquid crystal display (LCD), an organic light emitting diode display (OLED), and the like have been developed.

SUMMARY

Aspects of the disclosure provide a display device in which a peeling phenomenon of signal wirings of a display panel is reduced during rework of a printed circuit board.

It should be noted that objects of the disclosure are not limited to the above-described objects, and other objects of the disclosure will be apparent to those skilled in the art from the following descriptions.

According to an embodiment, there is provided a display device including: a base substrate on which a display area and a non-display area are disposed, the non-display area is disposed at a periphery of the display area; a first signal wiring disposed on the non-display area of the base substrate, and including a first wiring part and a second wiring part connected to the first wiring part; and a printed circuit board including a lead wiring disposed on the first signal wiring, wherein the first second part includes an open part passing through a surface of the second wiring part in a thickness direction, the second wiring part includes a long side extending along a first direction and a short side extending along a second direction intersecting the first direction, and a separation distance between the open part and an end of the short side of the second wiring part in the first direction is within about 0.4 times the long side of the second wiring part.

The display device may further include an insulating layer disposed between the first signal wiring and the second signal wiring, wherein the insulating layer may include at least one contact hole, and the first signal wiring and the second signal wiring may be electrically connected to each other through the at least one contact hole.

A size of the first signal wiring may be larger than a size of the second signal wiring when viewed in a plan view, and the first signal wiring may extend further outward from the second signal wiring when viewed in a plan view.

The display device may further include a first adhesive member disposed between the second signal wiring and the lead wiring, wherein the second signal wiring and the lead wiring may be electrically connected to each other through the first adhesive member.

The non-display area of the base substrate may include a top surface, a side surface, and an inclined surface connecting the top surface and the side surface.

The first signal wiring may not overlap the inclined surface.

The open part may have a recessed shape in a direction opposite to a direction toward the second wiring part.

The open part may include a first portion, a second portion spaced apart from the first portion along the second direction, and a third portion disposed between the first portion and the second portion, and each of the first and second portions may protrude toward the second wiring part more than the third portion when viewed in a plan view.

The first signal wiring may further include a third wiring part connected to the second wiring part, wherein the third wiring part may have a first width in the first direction, and a separation distance of a second width in the first direction may be between the first portion and the second portion, and the second width may be greater than the first width.

A separation distance between the second portion and the end of the first wiring part in the first direction may be within about 0.4 times the long side of the first wiring part.

A separation distance between the first portion and the second portion in the second direction may be larger than a width of the second wiring part in the second direction.

A part of the third portion facing the second wiring part may include a curved shape.

A part of the third portion facing the second wiring part may have a V-shape.

The second signal wiring may overlap the open part in the thickness direction.

The printed circuit board may further include a driver integrated circuit connected to the lead wiring.

The display device may further include a third wiring part spaced apart from the first wiring part with the second wiring part, wherein the third wiring part may be connected to the second wiring part, and a width of the third wiring part in the second direction may be smaller than a width of the second wiring part in the second direction.

The width of the third wiring part may be about equal to the width of the first wiring part in the second direction.

The third wiring part may be connected to a data wiring of the display area.

According to an embodiment, there is provided a display device including: a base substrate on which a display area and a non-display area disposed at a periphery of the display area; a first signal wiring disposed on the non-display area of the base substrate, and including a first wiring part and a second wiring part connected to the first wiring part; and a second signal wiring disposed on the first signal wiring, wherein the second wiring part includes an open part passing through a surface of the second wiring part in a thickness direction, and the open part has a shape that is recessed in a direction opposite to a direction toward the second wiring part.

The open part may include a first portion, a second portion spaced apart from the first portion along the second direction, and a third portion disposed between the first portion and the second portion, and each of the first and second portions may protrude toward the second wiring part more than the third portion when viewed in a plan view.

A separation distance between the first portion and the second portion in the second direction may be larger than a width of the second wiring part in the second direction.

The display device may further include a third wiring part spaced apart from the first wiring part with the second wiring part, wherein the third wiring part may be connected to the second wiring part, and a width of the third wiring part in the second direction may be smaller than a width of the second wiring part in the second direction.

According to a display device of the disclosure, a peeling phenomenon of signal wirings of the display panel can be reduced during the rework of a printed circuit board.

It should be understood that effects according to embodiments are not limited to the effects exemplified above, and other various effects are included in the specification.

BRIEF DESCRIPTION OF THE DRAWINGS

The above and other aspects and features of the disclosure will become more apparent by describing embodiments thereof in detail with reference to the attached drawings, in which.

DETAILED DESCRIPTION OF THE EMBODIMENTS

Figure 1:
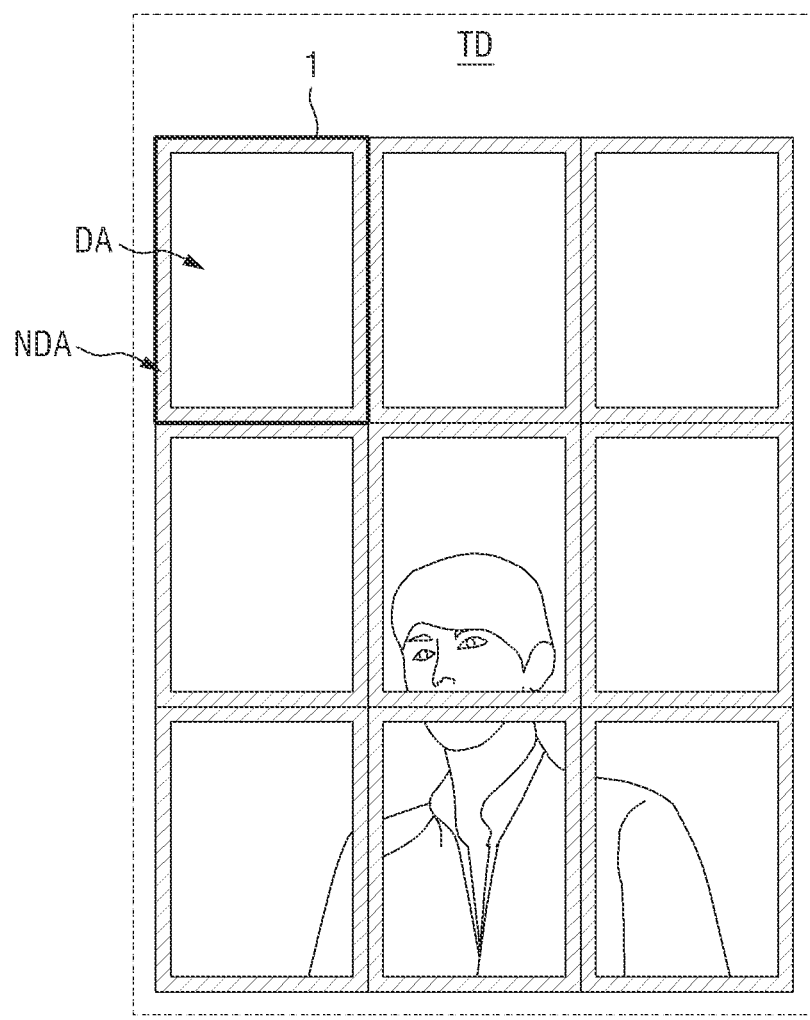
FIG. 1 is a view schematically illustrating a tile-type display device.

Advantages and features of the disclosure and descriptions of accomplishing the same will be understood more readily with reference to the following detailed description of the embodiments taken in conjunction with the accompanying drawings. However, the scope of the invention is not limited to the embodiments in the accompanying drawings and the specification and should be construed as including all the changes, equivalents and substitutions included in the spirit and scope of the disclosure. The embodiments disclosed herein are provided so that the disclosure will be thorough and complete and will fully convey the scope of the disclosure to those of ordinary skill in the art to which the disclosure pertains.

Some of the parts which are not associated with the description may not be provided in order to describe embodiments of the invention and like reference numerals refer to like elements throughout the specification.

In the drawings, sizes and thicknesses of elements may be enlarged for clarity and ease of description thereof. However, the invention is not limited to the illustrated sizes and thicknesses. In the drawings, the thicknesses of layers, films, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Although the terms such as "first" and "second" are used herein to describe various elements, it will be understood that these elements are not limited by the terms. These terms are used only to distinguish one element from another element. Thus, a first element discussed below could be termed as a second element without departing from the spirit and scope of the disclosure.

Hereinafter, embodiments of the disclosure will be described with reference to the accompanying drawings.

Figure 2:
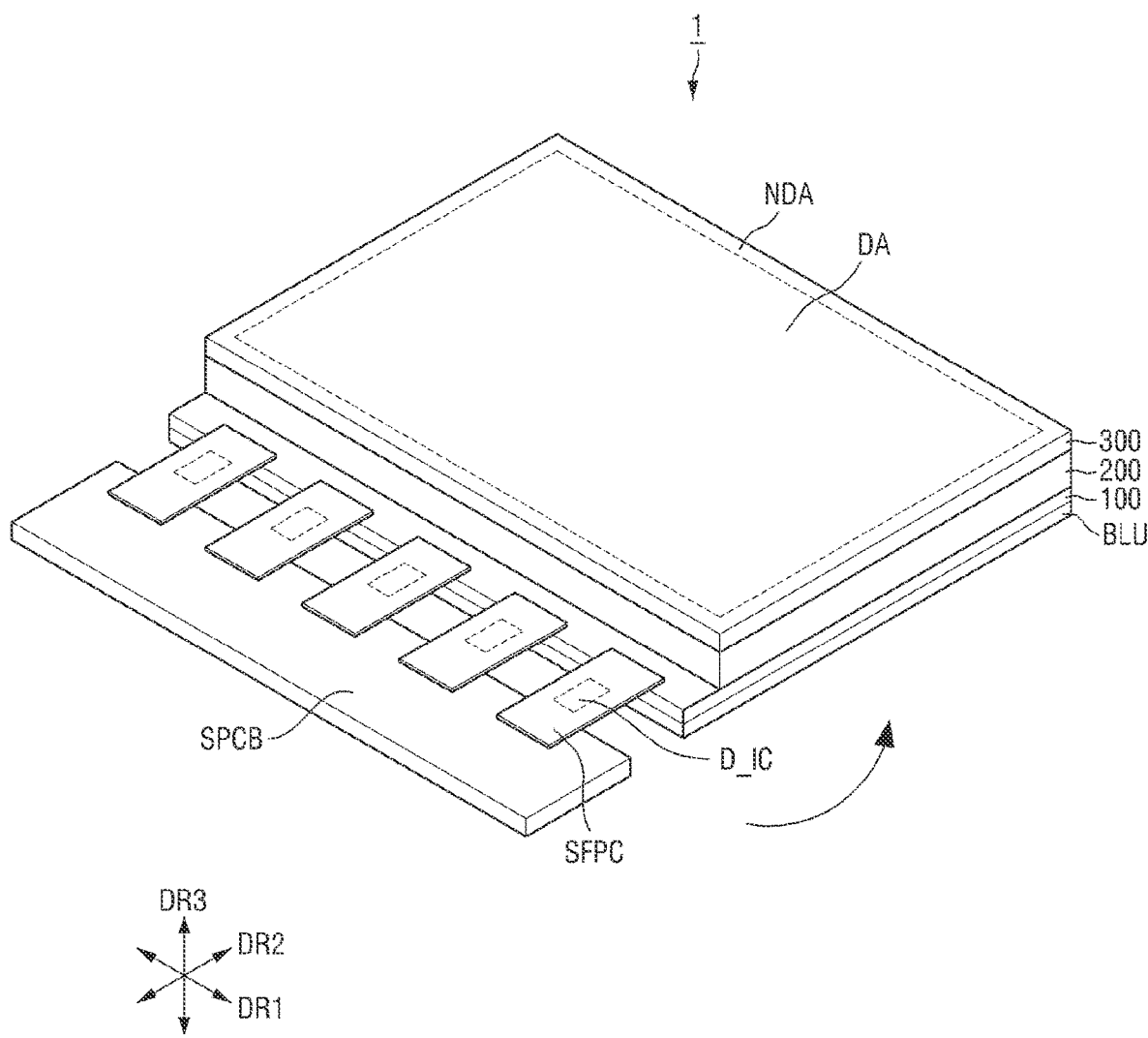
FIG. 2 is a perspective view of a display device according to an embodiment.
Figure 3:
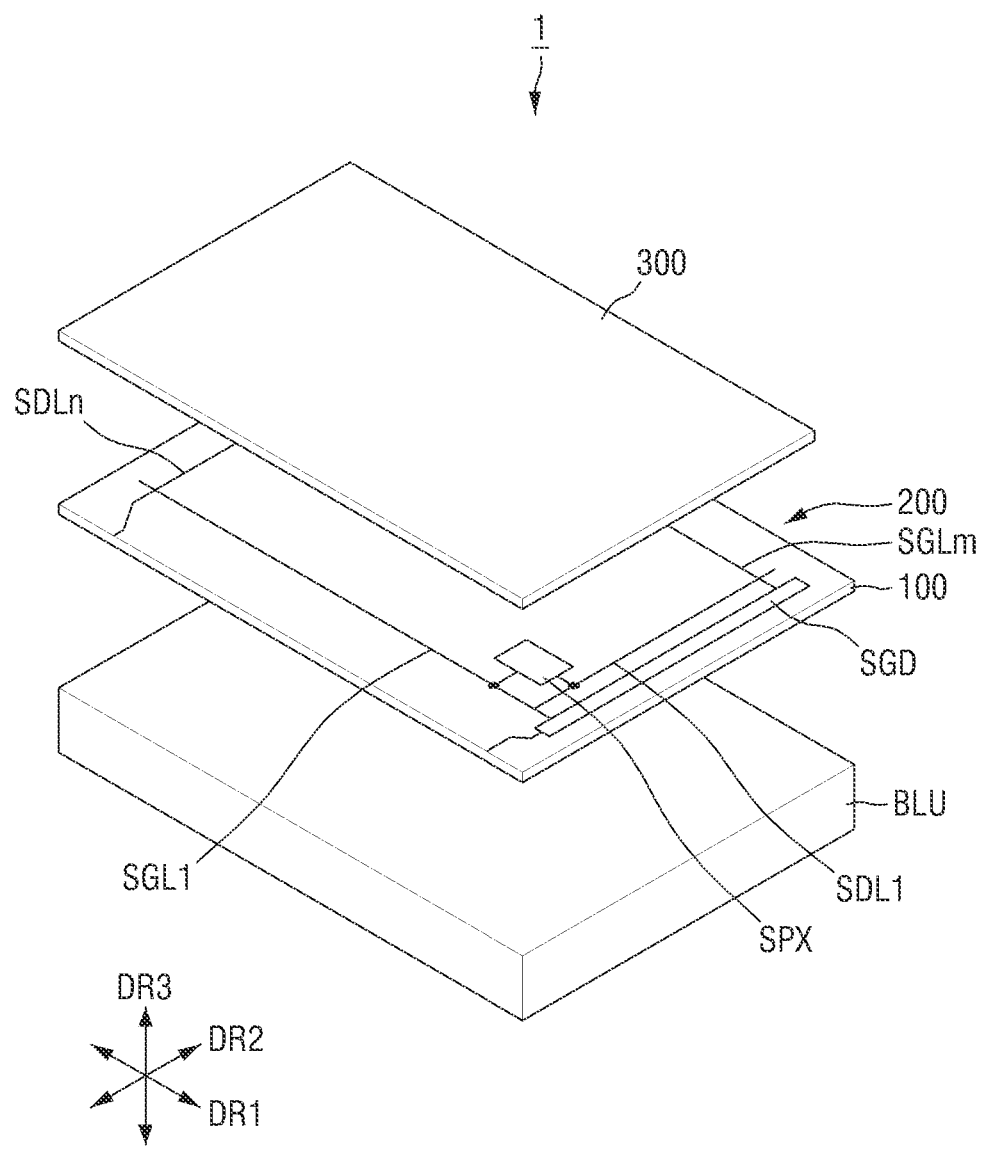
FIG. 3 is an exploded perspective view illustrating a part of the display device of FIG. 2.
Figure 4:
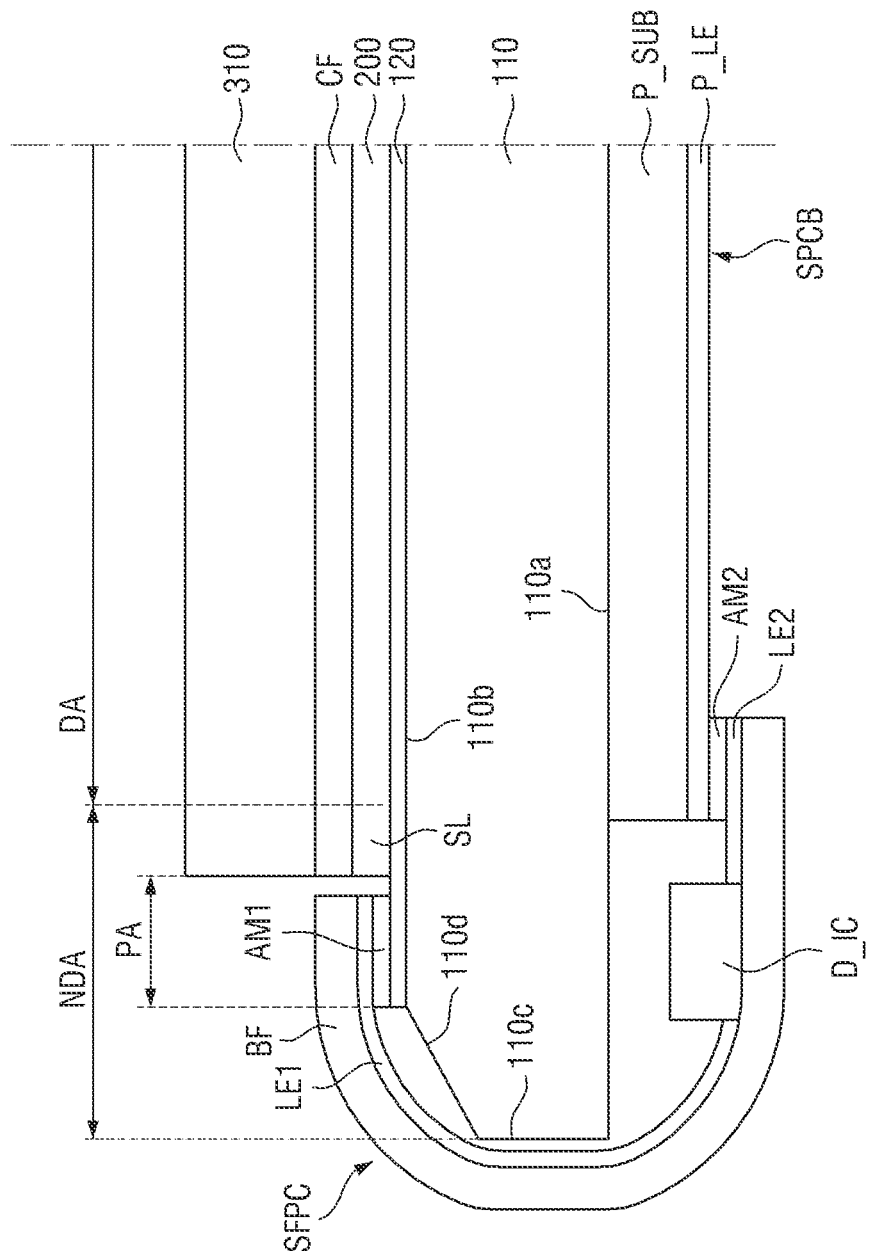
FIG. 4 is a schematic cross-sectional view of the display device.
Figure 5:
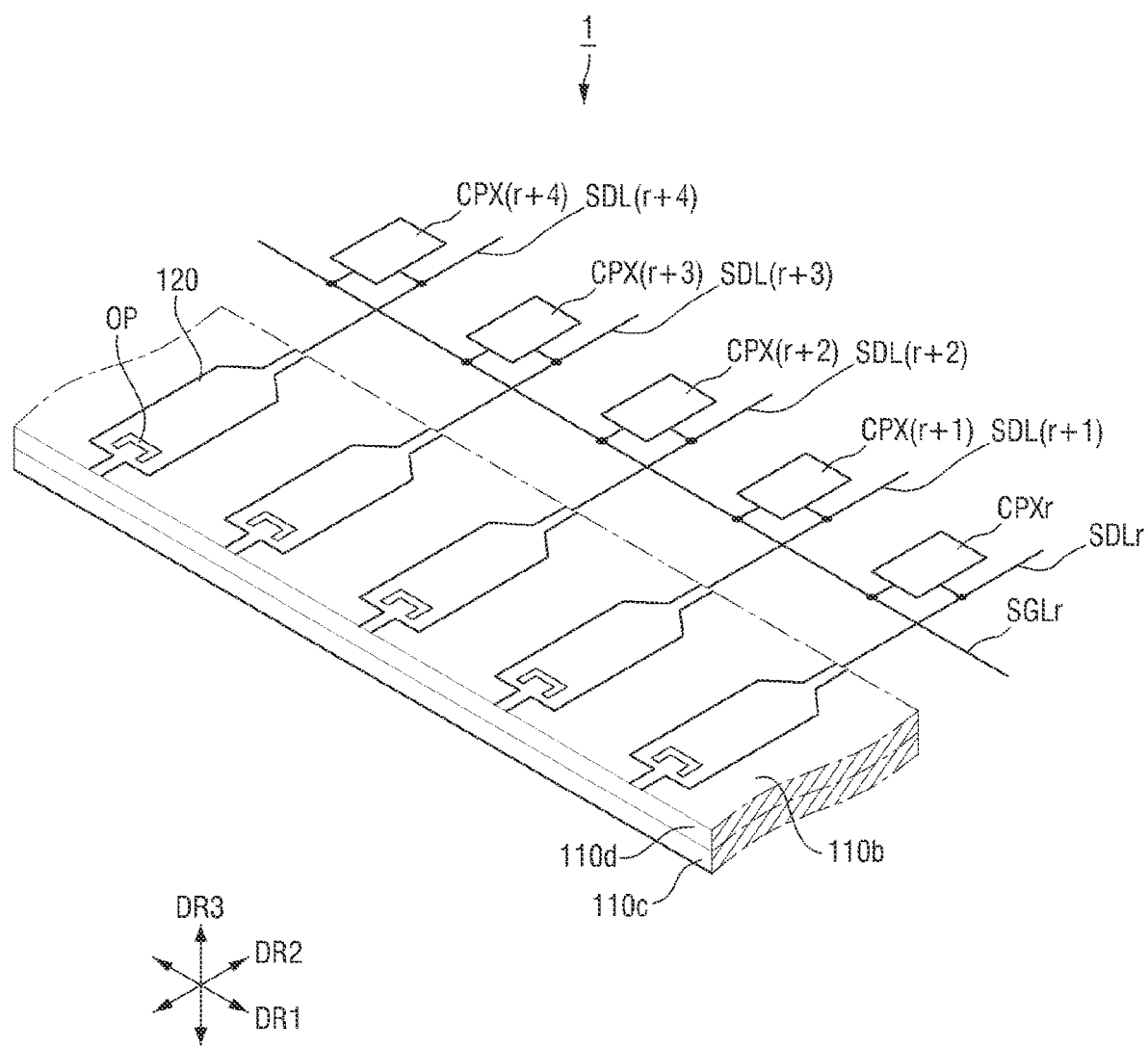
FIG. 5 is a view schematically illustrating a pixel area of a first substrate and signal wirings connected to the pixel area.

FIG. 1 is a view schematically illustrating a tile-type display device, FIG. 2 is a perspective view of a display device according to an embodiment, FIG. 3 is an exploded perspective view illustrating a part of the display device of FIG. 2, FIG. 4 is a schematic cross-sectional view of the display device, and FIG. 5 is a view schematically illustrating a pixel area of a first substrate and signal wirings connected to the pixel area.

In the following, embodiments will be described as an example in which the display device is a liquid crystal display including a liquid crystal layer, but the embodiment is not limited thereto. For example, when a display device other than the liquid crystal display (for example, an organic light emitting diode display) is employed, some elements described below may be omitted, or other elements not described below may be added.

The display device according to the embodiment may be applied to a large-sized electronic apparatus such as a television or an external billboard, as well as a small and medium-sized electronic apparatus such as a personal computer, a notebook computer, a vehicle navigation unit, or a camera. In addition, the display device may be applied to a tablet personal computer (PC), a smart phone, a personal digital assistant (PDA), a portable multimedia player (PMP), a game machine, a wristwatch-type electronic device, and the like. The above-described electronic apparatuses are merely examples, and the display device may be applied to other electronic apparatuses.

Referring to FIG. 1, a tile-type display device TD may include display devices 1. In an embodiment, the display devices 1 may be arranged in a lattice form, but the embodiment is not limited thereto. The display devices 1 may be connected in a first direction, connected in a second direction, and connected to have a specific or chosen shape. Each of the display devices may have the same size or similar size, but the embodiment is not limited thereto. The display devices may have mutually different sizes.

In the embodiment, the display devices 1 included in the tile-type display device TD may have a substantially rectangular shape including a long side and a short side. The display devices 1 may be arranged such that long sides or short sides are connected to each other. Some of the display devices 1 may form one side of the tile-type display device TD, some of the display devices 1 may be disposed at a corner of the tile-type display device TD to constitute two adjacent sides of the tile-type display device TD, and some of the display devices 1 may be disposed on an inner side of the tile-type display device TD so as to be surrounded by another display device 1. The display devices 1 may have different bezel shapes depending on positions of the display devices 1. Each display device may have the same or similar bezel shape.

The tile-type display device TD may be a flat display device 1, but the embodiment is not limited thereto. The tile-type display device TD may have a three-dimensional shape to give a three-dimensional effect. When the tile-type display device TD has a three-dimensional shape, each of the display devices 1 included in the tile-type display device TD may have a curved shape and may be connected to each other in a plane shape or at a predetermined angle to form an overall shape of the tile-type display device TD in a three-dimensional form.

The display devices 1 may be connected to each other such that bezels of the display devices 1 contact each other and may be connected to each other through a connection member (not shown). As described above, since the display devices 1 are connected to each other in the tile-type display device TD, bezel areas of the display devices 1 may overlap each other in a connection area so that each of the display devices 1 has a thin bezel, and a side connection pad may be provided to fulfill such an arrangement. The detailed description thereof will be given below.

Hereinafter, embodiments of the display device 1 applicable to one display device 1 of the tile-type display device TD or applicable as a single display device 1 will be described in detail.

Referring to FIGS. 2 to 5, each of the display devices 1 may include a first substrate 100, a liquid crystal layer 200, and a second substrate 300. In the embodiment, the display device 1 may further include a flexible circuit board SFPC, a driver circuit board SPCB, and a backlight unit BLU.

The first substrate 100, the second substrate 300, and the backlight unit BLU may have, for example, substantially rectangular shapes having long sides in a first direction DR1 and short sides in a second direction DR2 intersecting the first direction DR1. However, the shapes of the first substrate 100, the second substrate 300, and the backlight unit BLU are not limited thereto, and the first substrate 100, the second substrate 300, and the backlight unit BLU may have curved portions in a partial area thereof.

The backlight unit BLU may generate light and provide the generated light to the first substrate 100, the liquid crystal layer 200, and the second substrate 300. A display panel including the first substrate 100, the liquid crystal layer 200, and the second substrate 300 may generate an image using the light provided from the backlight unit BLU and provide the generated on a display screen or panel.

The display panel may include a display area DA in which an image is displayed and a non-display area NDA in which no image is displayed. The non-display area NDA may be, for example, an area surrounding the display area DA. Although not shown, the display device 1 may further include a window member disposed on an upper portion of the second substrate 300 to cover the display panel and transmit the image to the outside.

The backlight unit BLU may be, for example, an edge-type backlight unit or a direct-type backlight unit, but the embodiments are not limited thereto.

The first substrate 100 may be a thin film transistor substrate including at least one thin film transistor. The first substrate 100 may include a first base substrate 110 and elements disposed on the first base substrate 110. The elements may include at least one thin film transistor. Signal wirings 120 may be disposed on the first base substrate 110. The first base substrate 110 may include, but is not limited to, rigid quartz or glass.

The second substrate 300 may include a color filter substrate including a second base substrate 310 facing the first base substrate 110 and a color filter CF disposed on the second base substrate 310, between the second base substrate 310 and the liquid crystal layer 200.

The first substrate 100 may include pixels SPX. In the embodiment, the pixels SPX may be arranged in a matrix form, but the embodiment is not limited thereto. Gate wirings SGL1 to SGLm (where m is a natural number) and data wirings SDL1 to SDLn (where n is a natural number) may be disposed along a boundary of the pixels SPX. In this case, the gate wirings SGL1 to SGLm may serve as selection wirings for selecting the pixels SPX. The first substrate 100 may be a thin film transistor substrate including a thin film transistor or thin film transistors. The thin film transistor may include a gate electrode of the thin film transistor disposed on the same layer as the gate wiring described above, a semiconductor layer overlapping the gate electrode of the thin film transistor in a thickness direction, and a drain electrode and a source electrode which are connected to the semiconductor layer. The drain electrode and the source electrode may be disposed on the same layer and may be disposed on the same layer as the data wiring described above.

Although only one pixel SPX is shown in FIG. 3 for convenience of explanation, multiple pixels SPX may be substantially defined on the first substrate 100. Each of the pixels SPX may be provided with a pixel electrode for defining a pixel.

The gate wirings SGL1 to SGLm and the data wirings SDL1 to SDLn may be arranged to be insulated from each other and to intersect with each other. The gate wirings SGL1 to SGLm may extend in the first direction DR1 and may be electrically connected to a gate driver SGD. The data wirings SDL1 to SDLn may extend in the second direction DR2 and may be connected to a data driver.

The pixels SPX may be arranged to be electrically connected to the gate wirings SGL1 to SGLm and the data wirings SDL1 to SDLn which intersect with each other. The pixels SPX may be, for example, arranged in a matrix form, but the embodiments are not limited thereto.

The gate driver SGD may be, for example, disposed at a predetermined area adjacent to at least one short side among the short sides of the first substrate 100. However, a position of the gate driver SGD is not limited thereto.

The gate driver SGD may be, for example, formed simultaneously with a process of manufacturing transistors for driving the pixels SPX and mounted on the first substrate 100 in the form of an amorphous silicon TFT gate driver circuit (ASG) or an oxide silicon TFT gate driver circuit (OSG).

However, the embodiments are not limited thereto, and the gate driver SGD may be formed of driver chips and may be mounted on a flexible driver circuit board to be connected to the first substrate 100 by a tape carrier package (TCP) method. As an example, the gate driver SGD may be formed of driver chips and may be mounted on the first substrate 100 by a chip-on-glass (COG) method.

The data driver may include a source driver chip D_IC or a driver integrated circuit. The data driver may include one source driver chip D_IC or may include source driver chips D_IC. In the embodiment illustrated in FIG. 2, five source driver chips D_IC are arranged and described by way of an example, but it is apparent that the embodiment is not limited to the number of the source driver chips D_IC.

The driver circuit board SPCB may include, for example, a timing controller (not shown). The timing controller may be mounted on the driver circuit board SPCB in the form of an integrated circuit chip and electrically connected to the gate driver SGD and the data driver. The timing controller may output a gate control signal, a data control signal, and image data.

The gate driver SGD may receive the gate control signal from the timing controller. The gate driver SGD may generate a gate signal in response to the gate control signal and may sequentially output the generated gate signals. The gate signal may be provided to the pixels SPX on a row basis through the gate wirings SGL1 to SGLm. As a result, the pixels SPX may be driven on a row basis.

The data driver may receive the image data and the data control signal from the timing controller. The data driver may generate and output analog data voltages corresponding to the image data in response to the data control signal. The data voltages may be provided to the pixels SPX through the data wirings SDL1 to SDLn.

The pixels SPX may receive the data voltages through the data wirings SDL1 to SDLn in response to the gate signals provided through the gate wirings SGL1 to SGLm. The pixels SPX may display a gradation corresponding to the data voltages to control transmittance of an area where each of the pixels SPX is disposed.

Although the flexible circuit boards SFPC are shown as being adjacent to and connected to the long sides of the first and second substrates 100 and 300, the embodiments are not limited thereto. Positions at which the flexible circuit boards SFPC are connected to the first and second substrate 100 and 300 may be modified. For example, the flexible circuit boards SFPC may be adjacent to the short sides of the first and second substrates 100 and 300. As another example, the flexible circuit boards SFPC may be disposed on each of the long sides of the first and second substrates 100 and 300. As another example, the flexible circuit boards SFPC may be disposed on each of the short sides of the first and second substrates 100 and 300 and may be disposed on each of the long side and the short side.

The flexible circuit board SFPC may be plural in number. The flexible circuit boards SFPC may be spaced apart from each other along the first direction DR1. Each of the flexible printed circuit boards SFPC may be attached and electrically connected to the driver circuit board SPCB.

Referring to FIG. 5, the signal wiring 120 may be plural in number. The signal wirings 120 may be spaced apart from each other along the first direction DR1. The signal wirings 120 may be electrically connected to data wirings SDLr to SDL(r+4) (where r is a natural number), respectively. Each of the signal wirings 120 may extend to one end of the first substrate 100.

A gate wiring SGLr may intersect the data wirings SDLr to SDL(r+4). Pixels CPXr to CPX(r+4) (where r is a natural number) may be electrically connected to the gate wiring SGLr.

Although only five signal wirings 120 are shown in FIG. 5 for convenience of understanding, an actual number of the signal wirings 120 electrically connected to the data wirings SDLr to SDL(r+4) may be more or less than five.

The data wirings SDLr to SDL(r+4) may be electrically connected to the pixels CPXr to CPX(r+4), respectively. Accordingly, the signal wirings 120 may be electrically connected to the pixels CPXr to CPX(r+4), respectively.

Referring to FIG. 2, a source driver chip D_IC mounted on the flexible printed circuit board SFPC may generate data voltages for driving the electrically connected pixels CPXr to CPX(r+4). The data voltages thus generated may be transmitted to the data wirings SDLr to SDL(r+4).

As shown in FIG. 4, a sealant SL may be disposed between the first base substrate 110 of the first substrate 100 and the second base substrate 310 of the second substrate 300. The color filter CF of the second substrate 300 may improve the quality of the image output from the display device 1, and the sealant SL may be disposed along edges of the two first and second base substrates 110 and 310 of substrates 100 and 300 on an outer side of the color filter CF to prevent leakage of the liquid crystal layer 200 filled between the first and second substrates 100 and 300.

The non-display area NDA of the display device 1 may further include a pad area PA which may be an area where the signal wiring 120 is coupled to a first lead wiring LE1 of the printed circuit board SFPC. The pad area PA may be disposed at a center of the non-display area NDA when viewed from above (or in a plan view), but the embodiment is not limited thereto.

As shown in FIG. 4, the first base substrate 110 of the first substrate 100 may include a top surface 110b facing the second substrate 300, a bottom surface 110a which is an opposite surface of the top surface 110b, a side surface 110c, and an inclined surface 110d connecting the side surface 110c and the top surface 110b. The side surface 110c may not overlap the pad area PA.

The signal wiring 120 may be disposed on the top surface 110b of the first base substrate 110 and may not overlap the side surface 110c and the inclined surface 110d. In other words, the signal wiring 120 may extend to a point at which the inclined surface 110d of the first base substrate 110 starts.

The signal wiring 120 may include a first signal wiring and a second signal wiring disposed on the first signal wiring. The detailed description thereof will be given below.

The printed circuit board SFPC may include a base film BF, a first lead wiring LE1 disposed on the base film BF, a second lead wiring LE2, and a source driver chip D_IC for connecting the first lead wiring LE1 to the second lead wiring LE2. The first lead wiring LE1 and the second lead wiring LE2 may be disposed on the same layer, but the embodiment is not limited thereto.

The first lead wiring LE1 may be bonded to the signal wiring 120 located in the pad area PA as shown in FIG. 4. A first adhesive member AM1 may be disposed between the first lead wiring LE1 and the signal wiring 120.

The first adhesive member AM1 may include an anisotropic conductive film (ACF).

One end of the printed circuit board SFPC may be attached to the signal wiring 120 in the pad area PA, and the other end of the printed circuit board SFPC may be bent in the thickness direction and disposed on the bottom surface of the first base substrate 110 of the first substrate 100.

The driver circuit board SPCB may include a driving base board P_SUB and a circuit wiring P_LE disposed on the driving base board P_SUB.

The second lead wiring LE2 may be bonded to the circuit wiring P_LE through a second adhesive member AM2. The second adhesive member AM2 may be disposed between the second lead wiring LE2 and the circuit wiring P_LE. The second adhesive member AM2 may include the same material as the first adhesive member AM1 or may include a material different from that of the first adhesive member AM1.

As shown in FIG. 5, the signal wiring 120 may include an open part OP. The open part OP may include a through-hole completely passing through the signal wiring 120 from a surface of the signal wiring 120. This will be described below.

Figure 6:
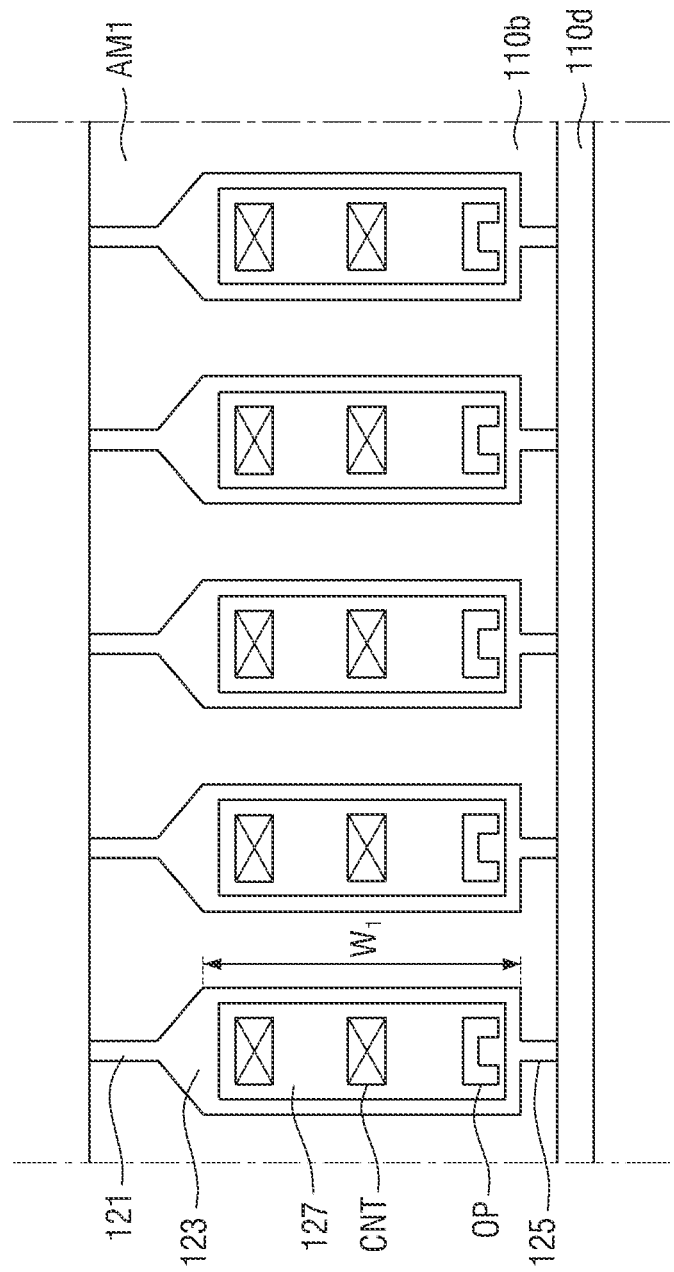
FIG. 6 is a plan view illustrating signal wirings arranged in a pad area.
Figure 7:
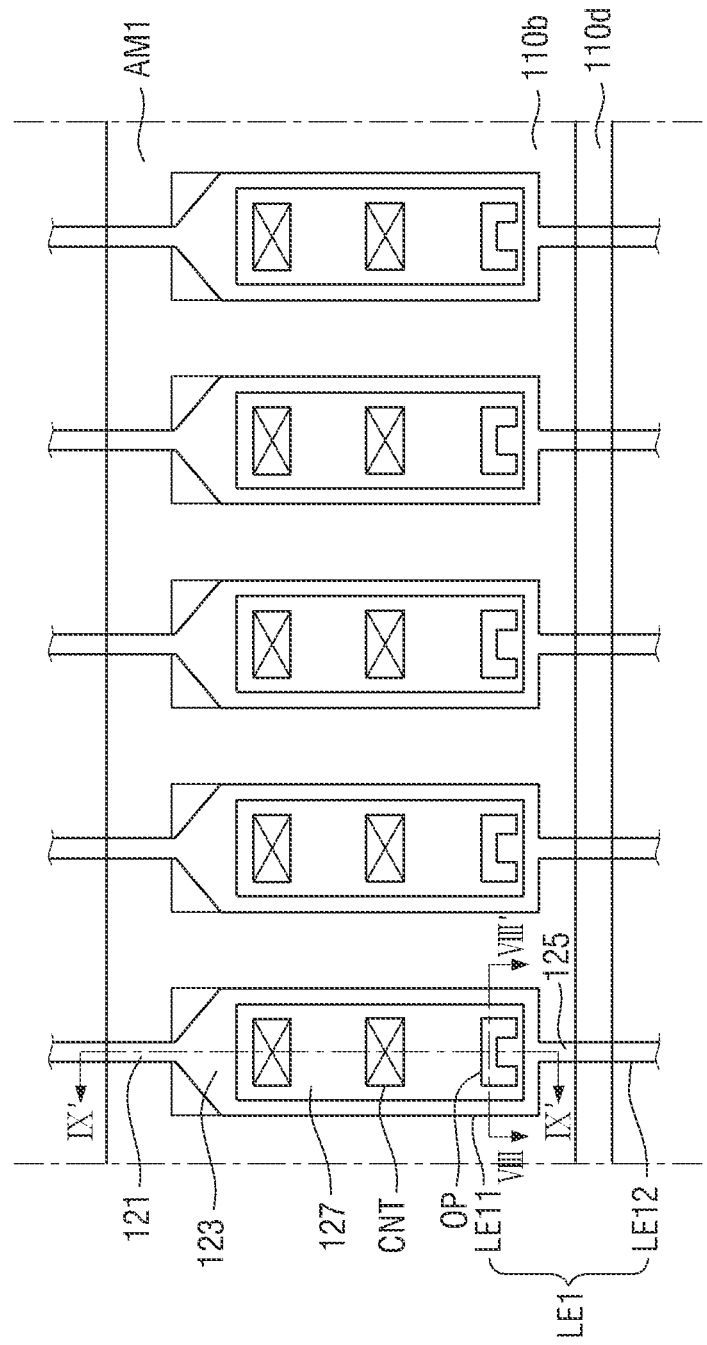
FIG. 7 is a plan view illustrating a configuration in which a printed circuit board is attached to the signal wirings.
Figure 8:
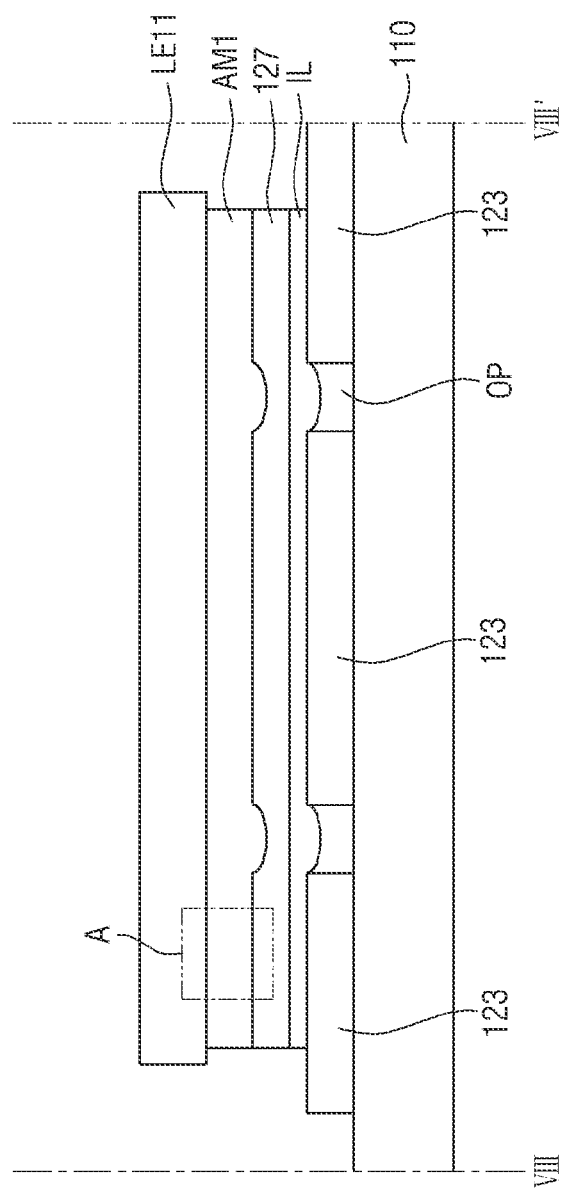
FIG. 8 is a schematic cross-sectional view taken along line VIII-VIII' of FIG. 7.
Figure 9:
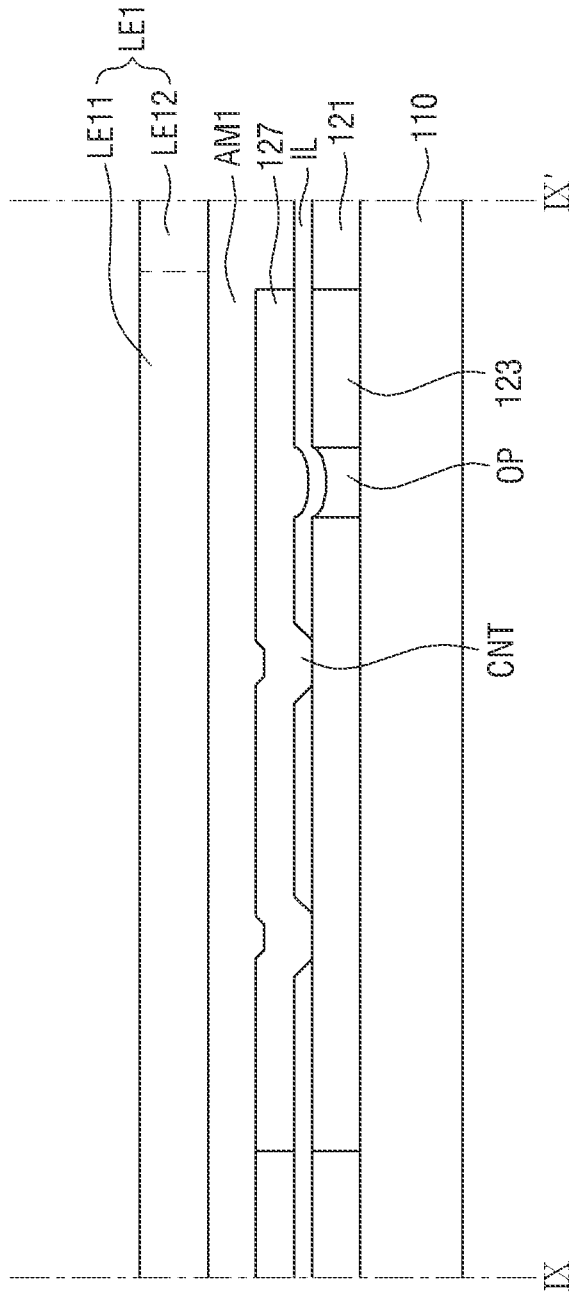
FIG. 9 is a schematic cross-sectional view taken along line IX-IX' of FIG. 7.
Figure 10:
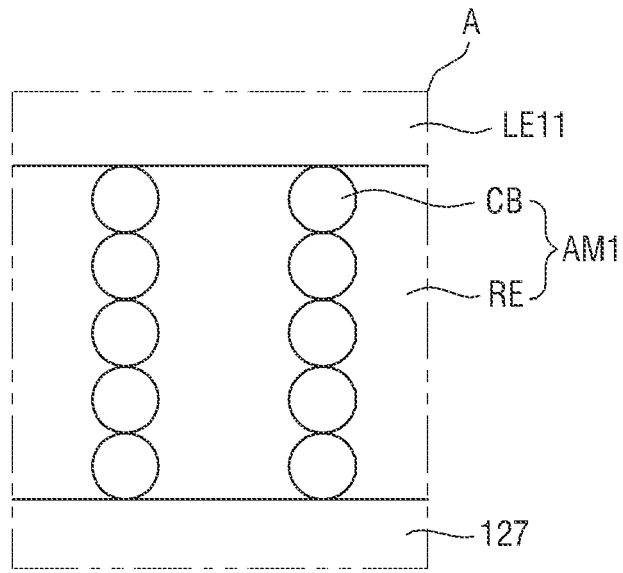
FIG. 10 is an enlarged view illustrating area A of FIG. 8.
Figure 11:
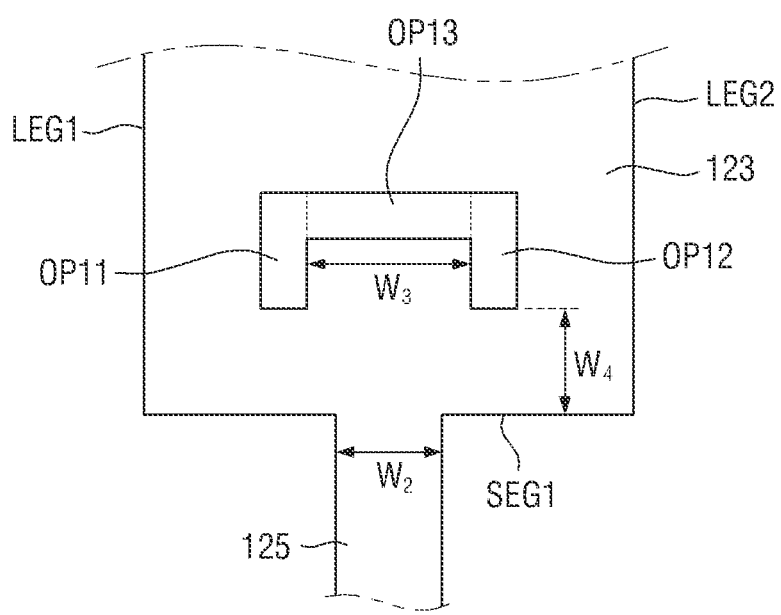
FIG. 11 is a partial enlarged view of a first signal wiring.

FIG. 6 is a plan view illustrating signal wirings arranged in a pad area, FIG. 7 is a plan view illustrating a configuration in which a printed circuit board is attached to the signal wirings, FIG. 8 is a schematic cross-sectional view taken along line VIII-VIII' of FIG. 7, FIG. 9 is a schematic cross-sectional view taken along line IX-IX' of FIG. 7, FIG. 10 is an enlarged view illustrating area A of FIG. 8, and FIG. 11 is a partial enlarged view of a first signal wiring.

Referring to FIGS. 6 to 11, the signal wiring 120 may include first signal wirings 121, 123, and 125 and a second signal wiring 127 disposed on the first signal wirings 121, 123, and 125. The first signal wirings 121, 123, and 125 may include a first wiring part 121 connected to the data wirings of the display area DA, a third wiring part 125 adjacent to an end (an end located on a short side) of the first base substrate 110, and a second wiring part 123 disposed between the first wiring part 121 and the third wiring part 125. In the following, although a configuration of the first signal wirings 121, 123, and 125 is divided into the first wiring part 121 connected to the data wirings of the display area DA, the third wiring part 125 adjacent to an end (an end located on a short side) of the first base substrate 110, and the second wiring part 123 disposed between the first wiring part 121 and the third wiring part 125, names of the elements are not limited thereto.

For example, the second wiring part 123 may be a first wiring part, and in this case, the first wiring part 121 may be defined as a second wiring part.

A width of the second wiring part 123 in the first direction DR1 may be larger than a width of the first wiring part 121 in the first direction DR1 and a width of the third wiring part 125 in the first direction DR1 as illustrated for example in FIGS. 5 and 6.

The second wiring part 123 may include a short side extending along the first direction DR1 and a long side extending along the second direction DR2 as illustrated for example in FIG. 5. The long side of the second wiring part 123 may have a first width $W_1$ as illustrated for example in FIG. 6. The first width $W_1$ may be, but is not limited to, about 0.3 mm.

The first signal wirings 121, 123, and 125, and first second and third wiring parts, may include a conductive material. Examples of the conductive material include, but are not limited to, at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first signal wirings 121, 123, and 125 may be a single film or a laminated film formed of the above-exemplified materials.

The second signal wiring 127 may be disposed on the second wiring part 123.

The second signal wiring 127 may overlap the second wiring part 123 in the thickness direction. The second signal wiring 127 may have a width in the first direction DR1 which is smaller than the width of the second wiring part 123 in the first direction DR1, but the embodiment is not limited thereto. The width of the second signal wiring 127 in the first direction DR1 may be equal to or greater than the width of the second wiring part 123 in the first direction DR1.

The second signal wiring 127 may include a conductive oxide material. Examples of the conductive oxide material may include indium tin oxide (ITO), indium zinc oxide (IZO), zinc oxide (ZnO), indium tin zinc oxide (ITZO), or magnesium oxide (MgO), but the embodiment is not limited thereto.

An insulating layer IL may be further disposed between the first signal wirings 121, 123, and 125 and the second signal wiring 127. The insulating layer IL may include an inorganic insulating material or an organic insulating material.

The insulating layer IL may include contact holes CNT. In FIG. 9, two contact holes CNT are shown, but the embodiment is not limited thereto. At least three contact holes CNT may be formed. As an example, the contact holes CNT are illustrated as being arranged in one row along the second direction DR2, but the embodiment is not limited thereto. The contact holes CNT may be arranged in at least two rows in the second direction DR2.

The second signal wiring 127 may be electrically connected to the first signal wirings 121, 123, and 125 through the contact holes CNT.

Referring to FIG. 7, the first lead wiring LE1 may include a first lead part LE11 and a second lead part LE12. The first lead part LE11 may overlap the second wiring part 123 in the thickness direction, and the second lead part LE12 may overlap the third wiring part 125 in the thickness direction. The second lead part LE12 may be connected to the source driver chip D_IC of the printed circuit board SFPC, and the first lead part LE11 may be spaced apart from the source driver chip D_IC with the second lead part LE12 interposed therebetween.

A width of the first lead part LE11 in the first direction DR1 may be larger than a width of the second lead part LE12 in the first direction DR1. The width of the first lead part LE11 in the first direction DR1 may be substantially the same as the width of the second wiring part 123 of the first signal wiring in the first direction DR1, but the embodiment is not limited thereto. The width of the first lead part LE11 in the first direction DR1 may be larger or smaller than the width of the second wiring part 123 in the first direction DR1.

The first adhesive member AM1 may overlap the first signal wirings 121, 123, and 125, the second signal wiring 127, and the first lead wiring LE1 in the thickness direction to cover the first signal wirings 121, 123, and 125, the second signal wiring 127, and the first lead wiring LE1 when viewed from above (or in a plan view).

The first adhesive member AM1 may be disposed between the second signal wiring 127 and the first lead part LE11 to electrically connect the first lead part LE11 to the second signal wiring 127.

As shown in FIG. 7, the second wiring part 123 may include the open part OP therein. The open part OP may completely pass through the second wiring part 123 in the thickness direction from a surface of the second wiring part 123 as described above. The open part OP may be completely surrounded by a constituent material of the second wiring part 123 when viewed from above (or in a plan view).

The open part OP may overlap the second signal wiring 127 and the first lead part LE11 in the thickness direction.

Referring to FIG. 8, the second wiring part 123 may include patterns 123*a* separated by the open part OP. A schematic cross-sectional view of the separated patterns is shown in FIG. 8. A plan view of the separated patterns is shown in FIG. 7, where the separated patterns are connected to each other.

Referring to FIG. 10, the first adhesive member AM1 may include a resin RE and conductive balls CB dispersed in the resin RE. The conductive balls CB may serve to electrically connect the first lead part LE11 to the second signal wiring 127.

Referring to FIG. 9, the first adhesive member AM1 may cover a top surface and side surfaces of the second signal wiring 127 and may contact an exposed top surface of the insulating layer IL.

Referring to FIG. 11, the second wiring part 123 may include long sides or long side edges LEG1 and LEG2 extending along the second direction DR2 and may include a short side or short side edge SEG1 extending along the first direction DR1. A first short side edge SEG1 may be physically connected to the third wiring part 125.

The open part OP according to one embodiment may be adjacent to the third wiring part 125. Referring to FIG. 11, a fourth width $W_4$ may be defined between the open part OP and the first short side edge SEG1.

In this specification, the fourth width $W_4$ may refer to a closest separation distance between the open part OP and the first short side edge SEG1.

The fourth width $W_4$ may be within about 0.4 times the first width $W_1$. When the printed circuit board SFPC is peeled from the first substrate 100, the signal wiring may be peeled from the third wiring part 125. If the fourth width $W_4$ is within about 0.4 times the first width $W_1$, the peeling of the signal wiring starting from the third wiring part 125 may be stopped at the open part OP adjacent to the third wiring part 125 so that a large area of the second wiring part 123 bonded to the first lead wiring LE1 may be substantially prevented from being peeled together with the third wiring part 125 in advance.

The open part OP according to an embodiment may have a shape that is recessed in a direction opposite to a direction toward the third wiring part 125.

In more detail, the open part OP may include a first portion OP11, a second portion OP12 spaced apart from the first portion OP11 in the first direction DR1, and a third portion OP13 disposed between the first portion OP11 and the second portion OP12.

Each of the first to third portions OP11 to OP13 may have a substantially rectangular shape when viewed from above (or in a plan view), but the embodiment is not limited thereto.

The first to third portions OP11 to OP13 may be physically connected to each other.

The first portion OP11 and the second portion OP12 may protrude toward the third wiring part 125 more than the third portion OP13. In other words, the third portion OP13 may be recessed in the direction opposite to the direction toward the third wiring part 125 more than the first portion OP11 and the second portion OP12.

A separation distance of a third width $W_3$ in the first direction DR1 may be defined between the first portion OP11 and the second portion OP12, and the third wiring part 125 may have a second width $W_2$ in the first direction DR1. The third width $W_3$ may be greater than the second width $W_2$.

The second width $W_2$ and the third width $W_3$ may have the following relationship.

$$W_3 - W_2 \geq \alpha \text{ (where } \alpha \text{ is } a \text{ rational number larger than 0)} \quad \text{[Formula 1]}$$

For example, $\alpha$ may be about 0.07 mm, but the embodiment is not limited thereto.

Since the third width $W_3$ is greater than the second width $W_2$, when the printed circuit board SFPC is peeled from the first substrate 100, the peeling of the signal wiring starting from the third wiring part 125 may be substantially stopped at the open part OP adjacent to the third wiring part 125. Accordingly, a large area of the second wiring part 123 bonded to the first lead wiring LE1 may be substantially prevented from being peeled together with the third wiring part 125 in advance.

Figure 12:
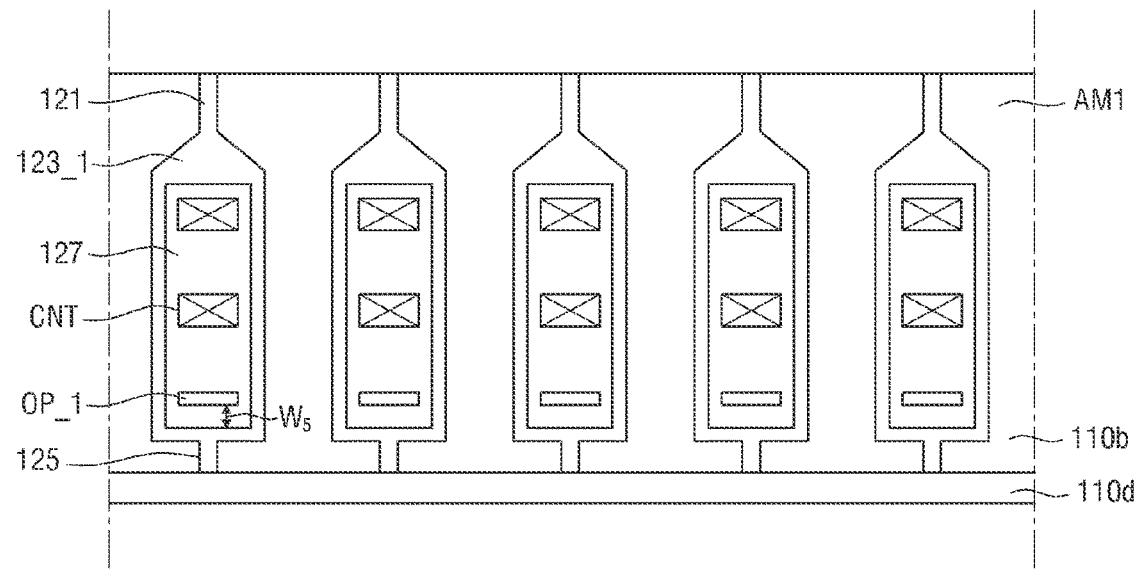
FIG. 12 is a plan view illustrating signal wirings arranged in a pad area according to an embodiment.
Figure 13:
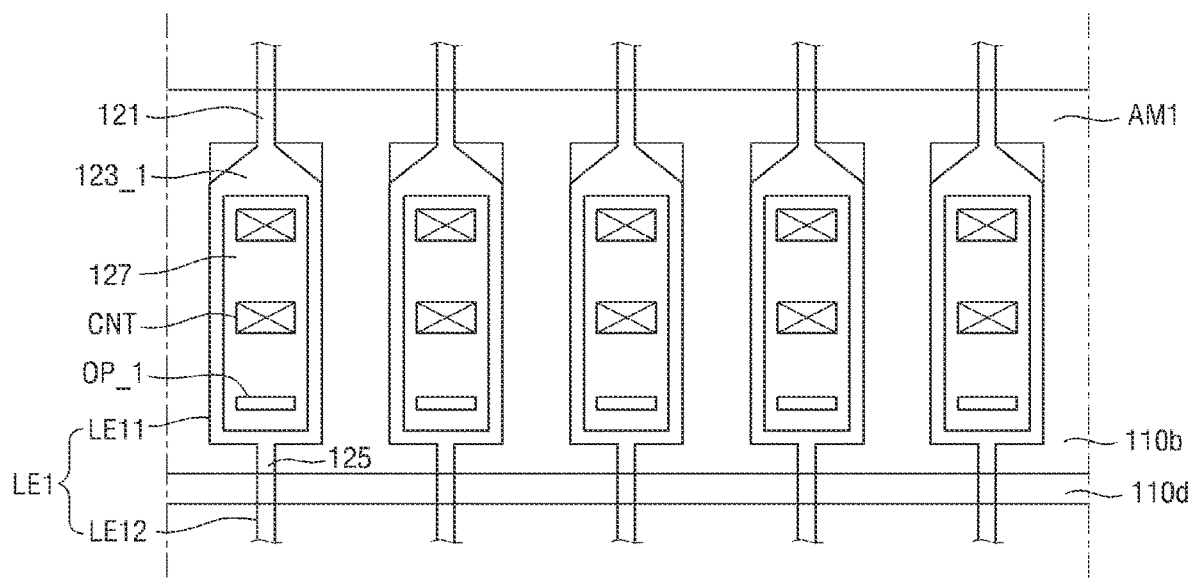
FIG. 13 is a plan view illustrating a configuration in which a printed circuit board is attached to the signal wirings according to an embodiment.

FIG. 12 is a plan view illustrating signal wirings arranged in a pad area according to an embodiment, and FIG. 13 is a plan view illustrating a configuration in which a printed circuit board is attached to the signal wirings according to an embodiment.

Referring to FIGS. 12 and 13, in a display device according to the embodiment, an open part OP_1 may be different from the open part OP according to an embodiment in that a shape of the open part OP_1 may be modified when viewed from above (or in a plan view).

In more detail, the open part OP_1 of the display device according to the embodiment may have a wiring shape extending along the first direction DR1 when viewed from above (or in a plan view).

The open part OP_1 may be adjacent to the third wiring part 125. A fifth width $W_5$ may be defined between the open part OP_1 and the first short side edge SEG1.

In this specification, the fifth width $W_5$ may refer to a closest separation distance between the open part OP_1 and the first short side edge SEG1.

The fifth width $W_5$ may be within about 0.4 times the first width $W_1$. When the printed circuit board SFPC is peeled from the first substrate 100, the signal wiring may be peeled from the third wiring part 125. If the fifth width $W_5$ is within about 0.4 times the first width $W_1$, the peeling of the signal wiring starting from the third wiring part 125 may be stopped at the open part OP_1 adjacent to the third wiring part 125 so that a large area of a second wiring part 123_1 bonded to the first lead wiring LE1 may be substantially prevented from being peeled together with the third wiring part 125 in advance.

Figure 14:
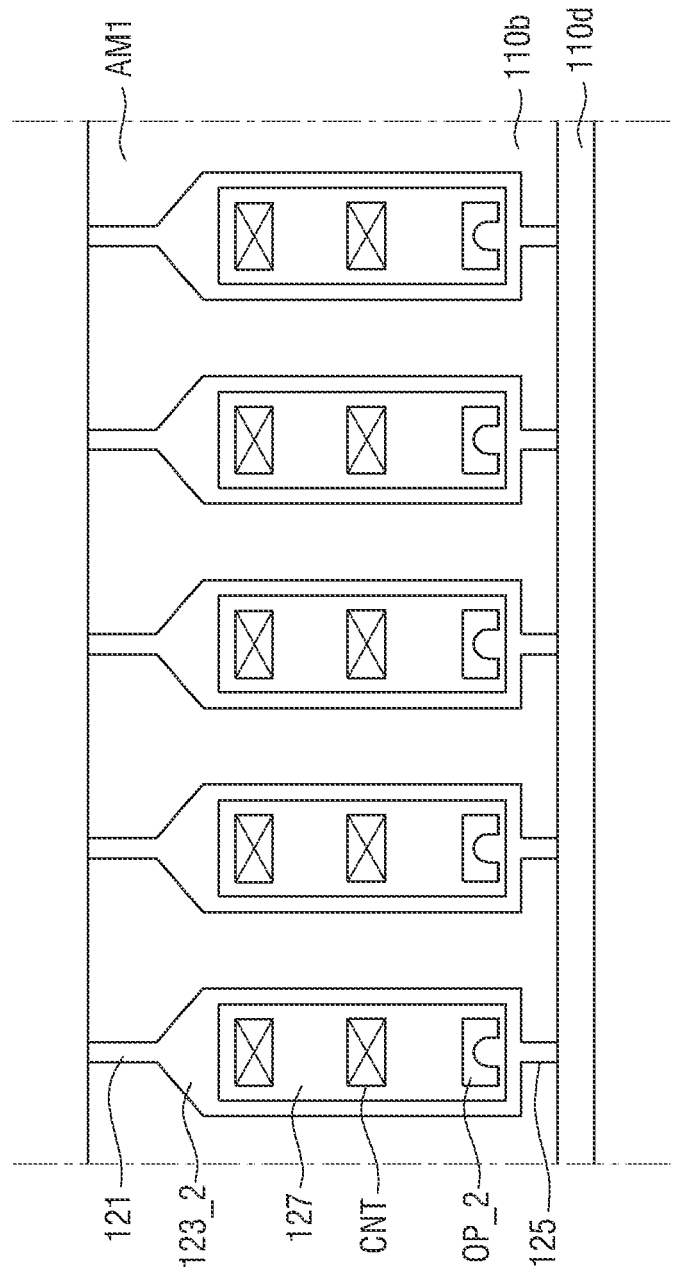
FIG. 14 is a plan view illustrating signal wirings arranged in a pad area according to an embodiment.
Figure 15:
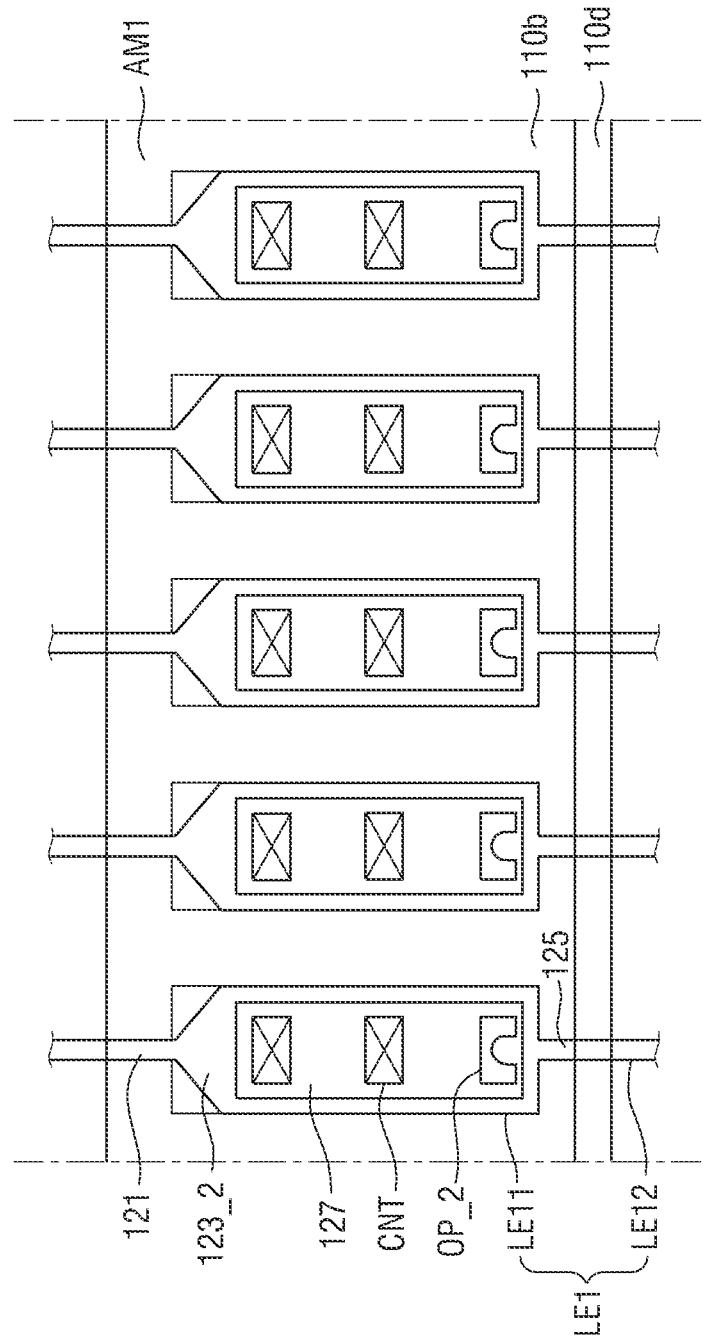
FIG. 15 is a plan view illustrating a configuration in which a printed circuit board is attached to the signal wirings according to an embodiment.

FIG. 14 is a plan view illustrating signal wirings arranged in a pad area according to an embodiment, and FIG. 15 is a plan view illustrating a configuration in which a printed circuit board is attached to the signal wirings according to an embodiment.

Referring to FIGS. 14 and 15, in a display device according to the embodiment, an open part OP_2 may be different from the open part OP according to an embodiment in that a shape of the open part OP_2 may be modified when viewed from above (or in a plan view).

In more detail, in the open part OP_2 according to the embodiment, a third portion (see OP13 in FIG. 11) does not have a rectangular shape, and a part facing the third wiring part 125 may include a curved shape.

In other words, the open part OP_2 may have an arch shape.

The open part OP_2 may be adjacent to the third wiring part 125. The fourth width $W_4$ may be defined between the open part OP_2 and the first short side edge SEG1.

In this specification, the fourth width $W_4$ may refer to a closest separation distance between the open part OP_2 and the first short side edge SEG1.

The fourth width $W_4$ may be within about 0.4 times the first width $W_1$. When the printed circuit board SFPC is peeled from the first substrate 100, the signal wiring may be peeled from the third wiring part 125. If the fourth width $W_4$ is within about 0.4 times the first width $W_1$, the peeling of the signal wiring starting from the third wiring part 125 may be stopped at the open part OP_2 adjacent to the third wiring part 125 so that a large area of a second wiring part 123_2 bonded to the first lead wiring LE1 may be substantially prevented from being peeled together with the third wiring part 125 in advance.

Figure 16:
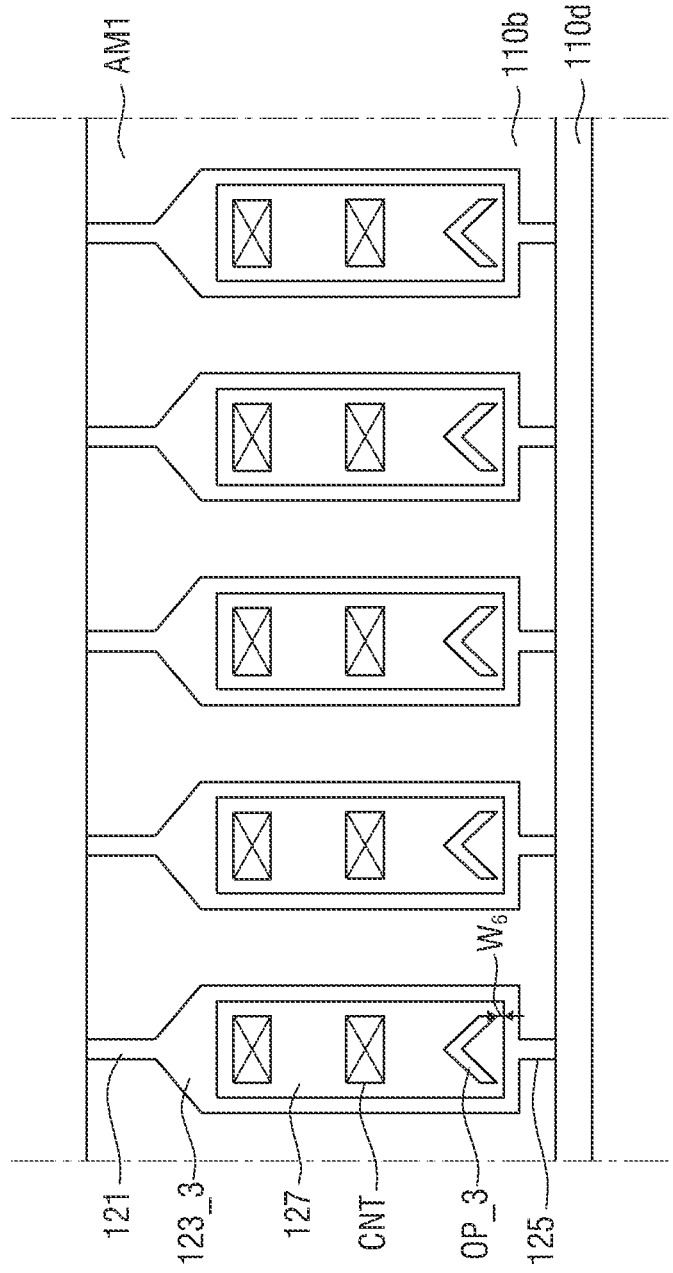
FIG. 16 is a plan view illustrating signal wirings arranged in a pad area according to an embodiment.
Figure 17:
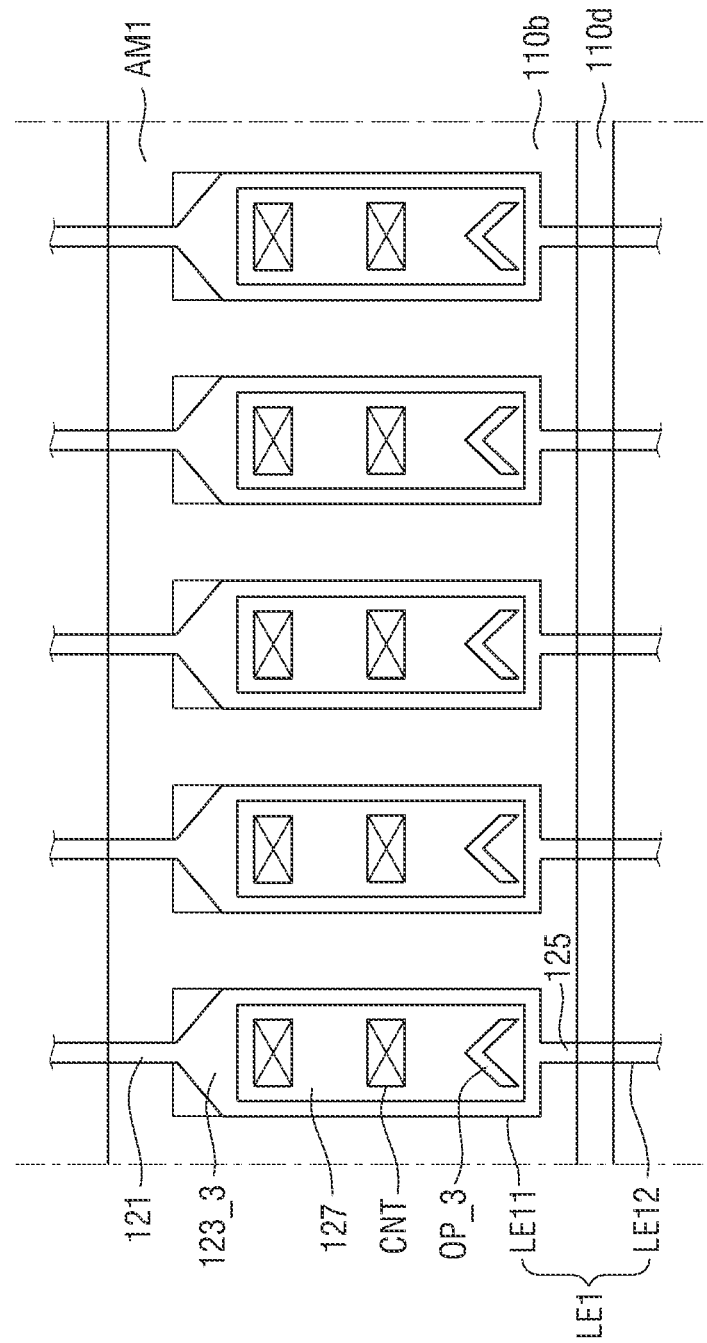
FIG. 17 is a plan view illustrating a configuration in which a printed circuit board is attached to the signal wirings according to an embodiment.

FIG. 16 is a plan view illustrating signal wirings arranged in a pad area according to an embodiment, and FIG. 17 is a plan view illustrating a configuration in which a printed circuit board is attached to the signal wirings according to an embodiment.

Referring to FIGS. 16 and 17, in a display device according to the embodiment, an open part OP_3 may be different from the open part OP according to an embodiment in that a shape of the open part OP_3 may be modified when viewed from above (or in a plan view).

In more detail, the open part OP_3 of the display device according to the embodiment may have a V-shape when viewed from above (or in a plan view). The V-shape may include an inverted V-shape such as a chevron shape, for example. A recessed portion of the V-shape may protrude in the direction opposite to the direction toward the third wiring part 125.

The open part OP_3 may be adjacent to the third wiring part 125. A sixth width $W_6$ may be defined between the open part OP_3 and the first short side edge SEG1.

In this specification, the sixth width $W_6$ may refer to a closest separation distance between the open part OP_3 and the first short side edge SEG1.

The sixth width $W_6$ may be within about 0.4 times the first width $W_1$. When the printed circuit board SFPC is peeled from the first substrate 100, the signal wiring may be peeled from the third wiring part 125. If the sixth width $W_6$ is within about 0.4 times the first width $W_1$, the peeling of the signal wiring starting from the third wiring part 125 may be stopped at the open part OP_3 adjacent to the third wiring part 125 so that a large area of a second wiring part 123_3 bonded to the first lead wiring LE1 may be substantially prevented from being peeled together with the third wiring part 125 in advance.

Figure 18:
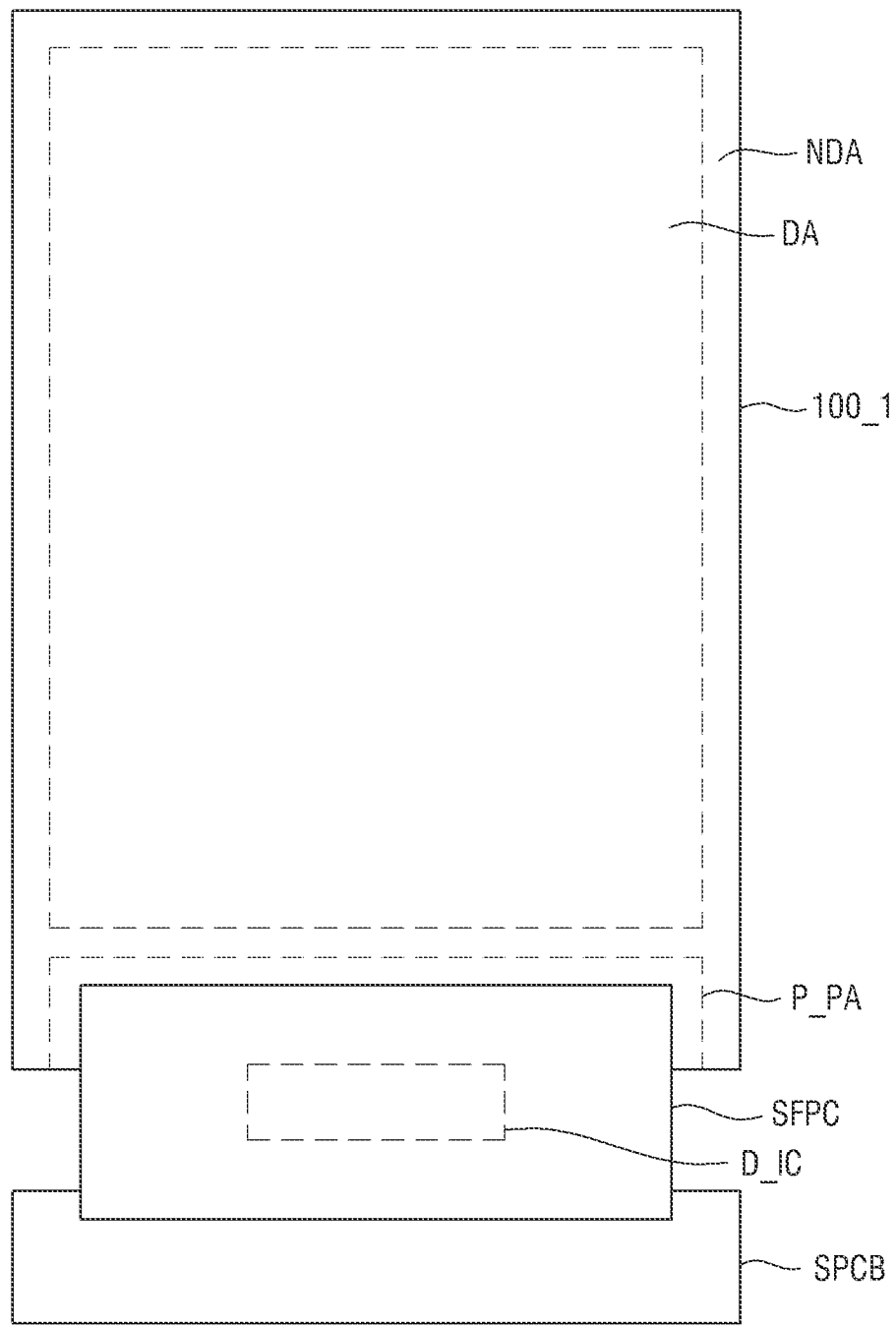
FIG. 18 is a plan layout view of a display device according to an embodiment.
Figure 19:
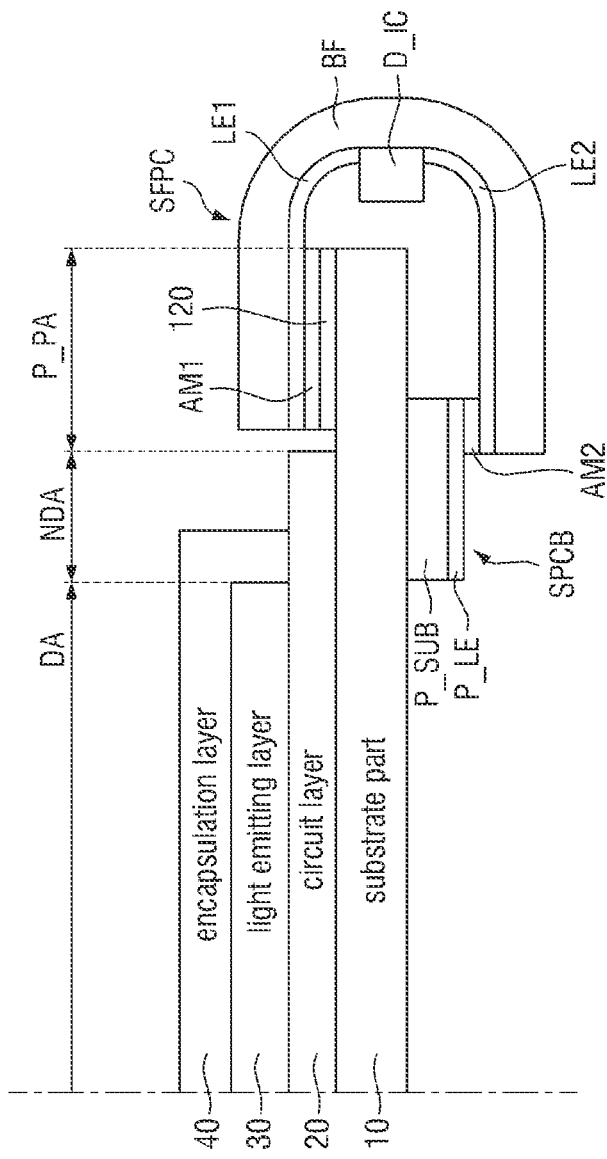
FIG. 19 is a schematic cross-sectional view of the display device according to an embodiment.

FIG. 18 is a plan layout view of a display device according to an embodiment, and FIG. 19 is a schematic cross-sectional view of the display device according to an embodiment.

Referring to FIGS. 18 and 19, a display device according to the embodiment may be different from the display device 1 according to an embodiment in that an organic light emitting diode display panel is described with reference to the embodiment.

In more detail, referring to FIGS. 18 and 19, the display device according to the embodiment may include a display panel 100_1 for displaying an image, a printed circuit board SFPC connected to the display panel 100_1, and a driver circuit board SPCB connected to the printed circuit board SFPC.

As the display panel 100_1, for example, an organic light emitting diode display panel may be applied in the embodiment. The display panel 100_1 includes a display area DA including pixel areas, and a non-display area NDA disposed at a periphery of the display area DA. The display area DA may have a substantially rectangular shape with perpendicular corners or a substantially rectangular shape with rounded corners when viewed from above (or in a plan view). The display area DA may have a short side and a long side. The short side of the display area DA may be a side extending in the first direction DR1. The long side of the display area DA may be a side extending in the second direction DR2. However, the shape of the display area DA is not limited to a rectangular shape when viewed from above (or in a plan view) but may be a circular shape, an elliptical shape, or various other shapes within the spirit and scope of the disclosure. The non-display area NDA may be adjacent to both short sides and both long sides of the display area DA. In this case, the non-display area NDA may surround all of the sides of the display area DA to form edges of the display area DA. However, the embodiment is not limited thereto, and the non-display area NDA may be adjacent only to both short sides or both long sides of the display area DA.

The non-display area NDA of the display panel 100 may further include a panel pad area P_PA. The panel pad area P_PA may be disposed, for example, at a periphery of one short side of the display area DA, but the embodiment is not limited thereto. The panel pad area P_PA may be disposed at a periphery of both short sides of the display area DA or may be disposed at a periphery of both short sides and both long sides of the display area DA.

The display panel 100 may include a substrate part 10, a circuit layer 20 disposed on the substrate part 10, a light emitting layer 30 disposed on the circuit layer 20, and an encapsulation layer 40 disposed on the light emitting layer 30.

The circuit layer 20 may control a light emission amount of the light emitting layer 30. The circuit layer 20 may include a display wiring, a display electrode, and at least one thin film transistor. The light emitting layer 30 may include an organic light emitting material. The light emitting layer 30 may be sealed by the encapsulation layer 40. The encapsulation layer 40 may seal the light emitting layer 30 to prevent moisture or the like from being introduced from the outside. The encapsulation layer 40 may be a single-layer or multilayer inorganic film, or a laminated film in which an inorganic film and an organic film are alternately laminated.

The substrate part 10 may include a base substrate. The base substrate may be a rigid substrate including rigid glass or quartz or may be a flexible substrate including a flexible material such as polyimide or other flexible material within the spirit and scope of the disclosure.

One end of the printed circuit board SFPC may be attached onto the panel pad area P_PA of the substrate part 10. The first lead wiring LE1 of the printed circuit board SFPC and a signal wiring of the substrate part 10 may be electrically connected to each other by the first adhesive member AM1 interposed therebetween.

In the display device according to the embodiment, the signal wiring may have the same shape as the signal wiring of the display device according to an embodiment except that the display device according to the embodiment includes the organic light emitting diode display panel.

Therefore, since the shape of the signal wiring is described above, the redundant detailed description thereof will be omitted.

Although the embodiments of the disclosure have been described with reference to the accompanying drawings, it will be understood by those of ordinary skill in the art to which the disclosure pertains that the disclosure may be implemented in other forms and or embodiments without departing from the spirit and scope of the disclosure. It is therefore to be understood that the embodiments described above are illustrative and should not be construed as limiting the disclosure.

What is claimed is:

1. A display device comprising:
a base substrate on which a display area and a non-display area are disposed, the non-display area being disposed at a periphery of the display area;
a first signal wiring disposed in the non-display area of the base substrate and including a first wiring part and a second wiring part connected to the first wiring part, the second wiring part including an open part in the non-display area passing completely through the second wiring part in a thickness direction; and
a flexible circuit board electrically connected to the first signal wiring; wherein
the first wiring part is located farther from the display area than the second wiring part,
in a plan view, the open part is recessed in a length direction of the second wiring part, and
the flexible circuit hoard includes a lead wiring which overlaps the open part of the second wiring part in the thickness direction.

2. The display device of claim 1, further comprising:
a second signal wiring in the non-display area of the base substrate disposed on the first signal wiring.

3. The display device of claim 2, wherein the length direction of the second wiring part is same as a direction from the first wiring portion toward the second wiring portion.

4. The display device of claim 1, wherein the open part includes:
a first portion;
a second portion spaced apart from the first portion along a second direction; and
a third portion disposed between the first portion and the second portion, wherein
each of the first and second portions protrudes toward the second wiring part more than the third portion in a plan view.

5. The display device of claim 4, wherein a separation distance between the first portion and the second portion in the second direction is larger than a width of the second wiring part in the second direction.

6. The display device of claim 1, further comprising:
a third wiring part spaced apart from the first wiring part with the second wiring part, wherein
the third wiring part is connected to the second wiring part, and
a width of the third wiring part in a second direction is smaller than a width of the second wiring part in the second direction.

7. The display device of claim 2, further comprising:
an insulating layer disposed between the first signal wiring and the second signal wiring, wherein the insulating layer includes at least one contact hole, and the first signal wiring and the second signal wiring are electrically connected to each other through the at least one contact hole.

8. The display device of claim 2, wherein a size of the first signal wiring is larger than a size of the second signal wiring in a plan view, and the first signal wiring extends further outward from the second signal wiring in a plan view.

9. The display device of claim 8, further comprising:

a first adhesive member disposed between the second signal wiring and the lead wiring, wherein the second signal wiring and the lead wiring are electrically connected to each other through the first adhesive member.

10. The display device of claim 1, wherein the non-display area of the base substrate includes a top surface, a side surface, and an inclined surface connecting the top surface and the side surface.

11. A display device comprising:

a base substrate on which a display area and a non-display area are disposed, the non-display area being disposed at a periphery of the display area;

a first pad layer disposed in the non-display area of the base substrate and including an open part in the non-display area; and a flexible circuit board electrically connected the first pad layer, wherein the open part has a recessed portion in a length direction of the first pad in a plan view, and the flexible circuit board includes a lead wiring overlaps the open part of the first pad layer in a thickness direction of the display device.

12. The display device of claim 11, wherein the open part comprises a main open portion and the recessed portion, and the main open portion extends in a width direction of the first pad in a plan view.

13. The display device of claim 11, wherein the open part passes completely through the second wiring part.

14. The display device of claim 11, wherein the open part is bar-shaped as seen in plan view.

15. The display device of claim 11, wherein the open part is U-shaped as seen in plan view.

* * * * *